ations: 13/541,763
United States Patent
Lin et al.

(10) Patent No.: US 8,936,990 B2
(45) Date of Patent: Jan. 20, 2015

(54) MANUFACTURING METHOD OF POWER TRANSISTOR DEVICE WITH SUPER JUNCTION

(75) Inventors: Yung-Fa Lin, Hsinchu (TW); Shou-Yi Hsu, Hsinchu County (TW); Meng-Wei Wu, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 162 days.

(21) Appl. No.: 13/541,763

(22) Filed: Jul. 4, 2012

(65) Prior Publication Data

US 2013/0134487 A1  May 30, 2013

(30) Foreign Application Priority Data

Nov. 29, 2011  (TW) .............................. 100143697 A

(51) Int. Cl.
*H01L 29/72*  (2006.01)

(52) U.S. Cl.
USPC .................... 438/301; 257/288; 257/E21.409; 257/E29.255

(58) Field of Classification Search
CPC .............. H01L 29/665; H01L 29/6656; H01L 29/7839
USPC ............ 438/301; 257/288, E21.409, E29.255
See application file for complete search history.

(56) References Cited

U.S. PATENT DOCUMENTS

| 7,859,048 | B2 | 12/2010 | Kagata |
| 2006/0214221 | A1 | 9/2006 | Challa |
| 2008/0224204 | A1* | 9/2008 | Saggio et al. ................. 257/328 |
| 2009/0321819 | A1* | 12/2009 | Kagata et al. ................. 257/330 |
| 2010/0059818 | A1 | 3/2010 | Sasaki |
| 2010/0084706 | A1 | 4/2010 | Kocon |
| 2011/0049614 | A1 | 3/2011 | Gao |
| 2011/0227147 | A1 | 9/2011 | Li |

* cited by examiner

*Primary Examiner* — Edward Wojciechowicz
(74) *Attorney, Agent, or Firm* — Winston Hsu; Scott Margo

(57) ABSTRACT

The present invention provides a power transistor device with a super junction including a substrate, a first epitaxial layer, a second epitaxial layer, and a third epitaxial layer. The first epitaxial layer is disposed on the substrate, and has a plurality of trenches. The trenches are filled up with the second epitaxial layer, and a top surface of the second epitaxial layer is higher than a top surface of the first epitaxial layer. The second epitaxial layer has a plurality of through holes penetrating through the second epitaxial layer and disposed on the first epitaxial layer. The second epitaxial layer and the first epitaxial layer have different conductivity types. The through holes are filled up with the third epitaxial layer, and the third epitaxial layer is in contact with the first epitaxial layer. The third epitaxial layer and the first epitaxial layer have the same conductivity type.

9 Claims, 13 Drawing Sheets

MANUFACTURING METHOD OF POWER TRANSISTOR DEVICE WITH SUPER JUNCTION

BACKGROUND OF THE INVENTION

1. Field of the Invention

The present invention generally relates to a power transistor device and a manufacturing method thereof, and more particularly, to a power transistor device with a super junction and a manufacturing method thereof.

2. Description of the Prior Art

In a power transistor device, power consumption is directly proportional to on resistance (RDS(on)) between drain and source of the device, and thus the power consumption of the power transistor device can be reduced by decreasing the on resistance. Resistance generated from an epitaxial layer used for withstanding high voltage represents the largest percentage of the on resistance. The resistance of the epitaxial layer can be decreased by increasing the doping concentration of the dopant therein; however, the epitaxial layer is used to withstand high voltages, and the breakdown voltage of the epitaxial layer is reduced when the doping concentration is increased, so that ability to tolerate the high voltage of the power transistor device is reduced.

In order to overcome these drawbacks, a kind of power transistor device having a super junction structure is developed to have both high voltage bearing ability and low on-resistance. In conventional power transistor device, several alternately arranged P-type epitaxial layers and N-type epitaxial layers are disposed on the substrate and several parallel PN junctions, which are vertical to the substrate, are therefore formed. In a conventional method for fabricating a power transistor device, a plurality of deep trenches is etched into an N-type epitaxial layer through an etching process. Then, a P-type epitaxial layer is filled into each deep trench. However, when an aspect-ratio of deep trenches increases, it becomes harder to have P-type epitaxial layers conformally fill into the corresponding deep trenches. As a result, some defects are formed at the interface between the N-type epitaxial layer and the P-type epitaxial layers. Furthermore, voids may inevitably appear within the P-type epitaxial layers. Therefore, a voltage sustaining ability of the super junction structure is reduced.

In light of the above, there is a need to provide an improved super junction power transistor device and a fabrication method thereof, which is not constrained by limits of fabricating deep trenches and can reduce the difficulty on epitaxial growth processes.

SUMMARY OF THE INVENTION

One purpose of the present invention is to provide a power transistor device with a super junction and a method of manufacturing the same, which can overcome restrictions on etching processes for forming trenches and reduce difficulties of epitaxial growth process.

To address this and other objectives, according to one embodiment of the invention, the present invention provides a power transistor device with a super junction, which includes a substrate, a first epitaxial layer, a second epitaxial layer, and a third epitaxial layer. The substrate has a first conductivity type. The first epitaxial layer is disposed on the substrate and has a plurality of trenches. The trenches are filled up with the second epitaxial layer, and a top surface of the second epitaxial layer is higher than a top surface of the first epitaxial layer. The second epitaxial layer has a plurality of through holes penetrating through the second epitaxial layer and disposed on the first epitaxial layer. The second epitaxial layer and the first epitaxial layer have different conductive types. The through holes are filled up with the third epitaxial layer, and the third epitaxial layer is in contact with the first epitaxial layer. The third epitaxial layer and the first epitaxial layer have the same conductive type.

According to another embodiment of the invention, a method for manufacturing a power transistor device with a super junction is provided. First, a substrate having a first conductivity type is provided and a first epitaxial layer is disposed on the substrate. The first epitaxial layer is patterned to form a plurality of trenches. Subsequently, a second epitaxial layer is formed on the first epitaxial layer and fills up the trenches with the second epitaxial layer, wherein the second epitaxial layer and the first epitaxial layer have different conductivity type. Then, the second epitaxial layer is patterned to form a plurality of first through holes in the second epitaxial layer, wherein the through holes can expose the first epitaxial layer. Finally, a third epitaxial layer is formed on the second epitaxial layer, wherein the third epitaxial layer fills up the first through holes and is in contact with the first epitaxial layer, and the third epitaxial layer and the first epitaxial layer have the same conductivity type.

The present invention repeatedly performs an N-type epitaxial growth process, a patterning process, a P-type epitaxial growth process and a patterning process to respectively stack N-type epitaxial layers and P-type epitaxial layers on a substrate. Additionally, this stack structure can form a super junction structure with a predetermined height. Since the P-type epitaxial layers are filled into trenches through many repeated epitaxial growth processes, problems resulting from conventional one-step filling process can be avoided. As a result, no void will appear in the P-type epitaxial layers and no defects will exist at the interface of PN junctions. Accordingly, restrictions on etching processes for forming trenches and on epitaxial growth processes can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
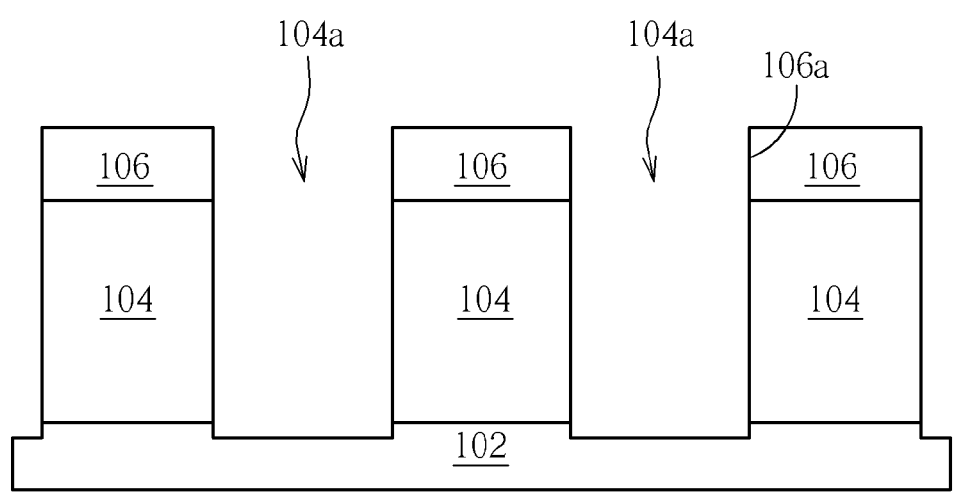
FIGS. 1 to 8 are schematic, cross-sectional diagrams illustrating a method of manufacturing a power transistor device according a first embodiment of the present invention.
Figure 6:
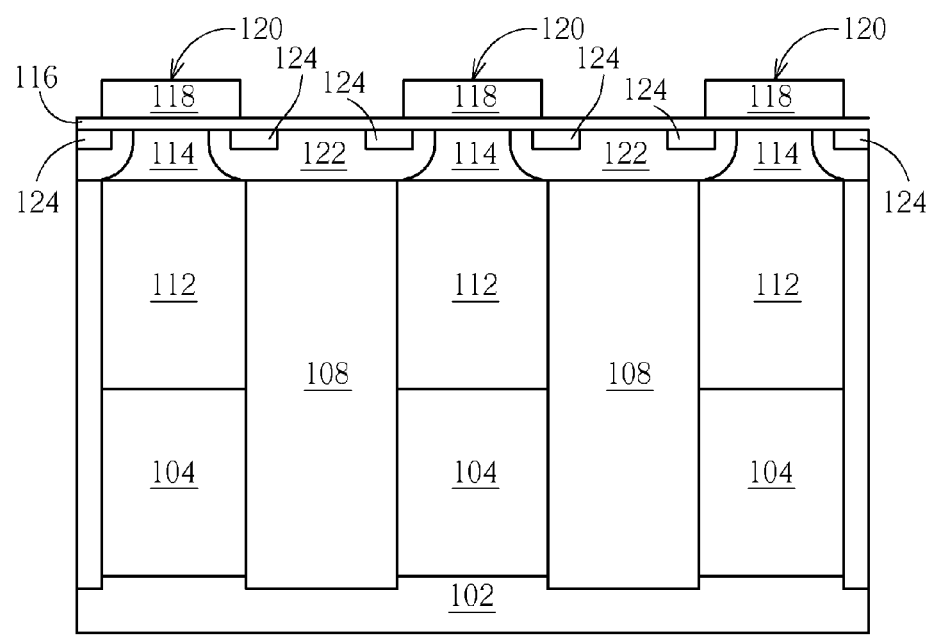
Figure 7:
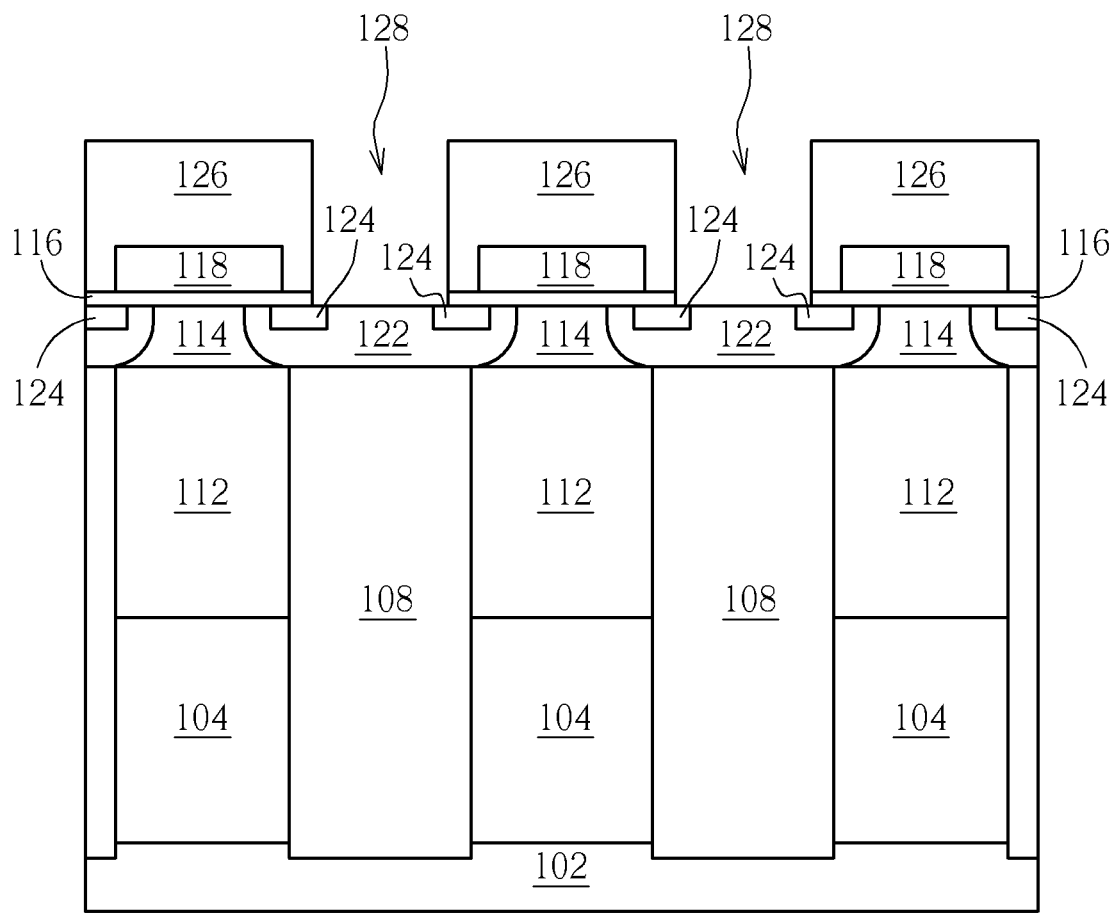
Figure 8:
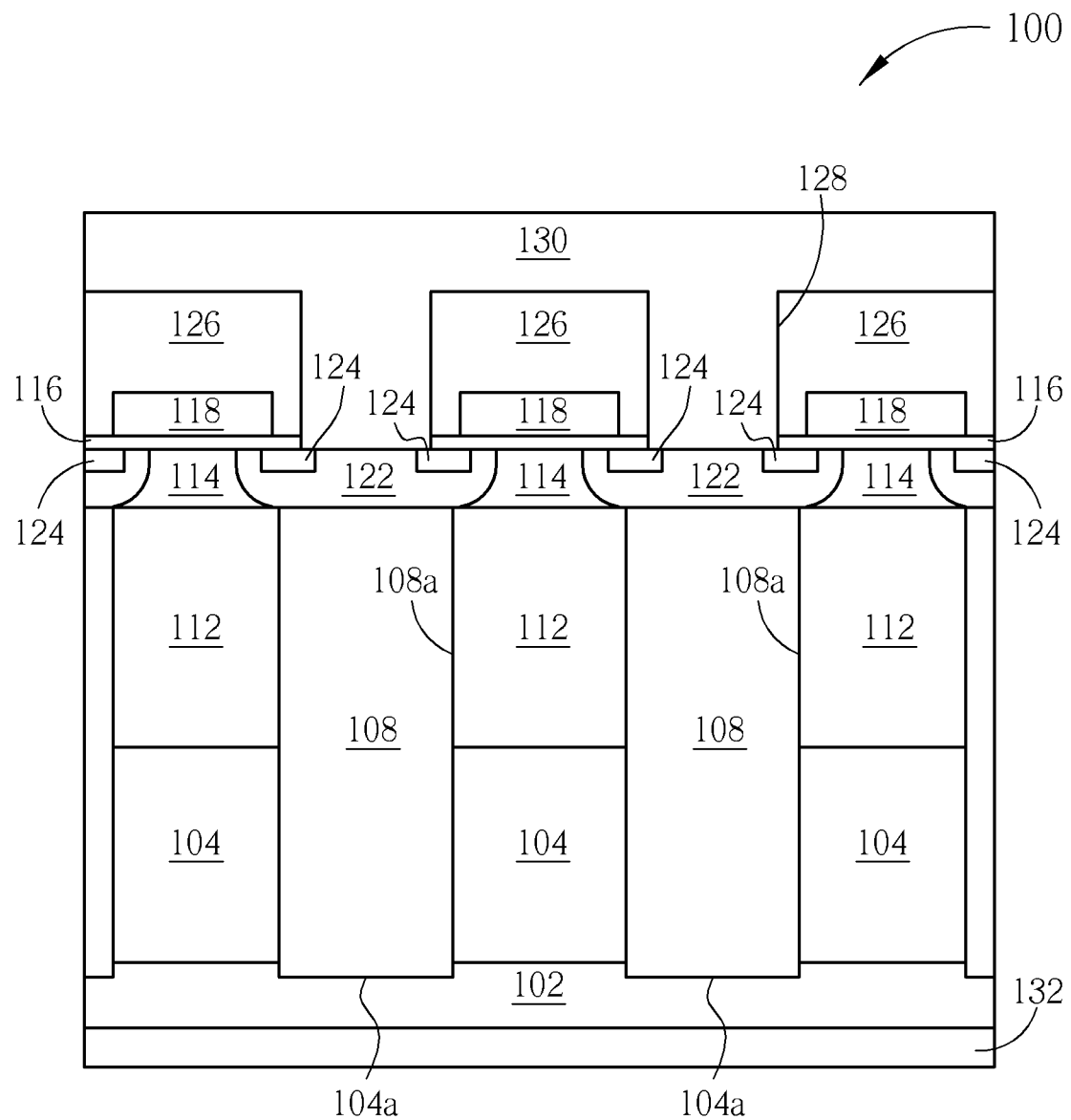

Please refer to FIGS. 1 to 8. FIGS. 1 to 8 are schematic, cross-sectional diagrams illustrating a method of manufacturing a power transistor device according to the first embodiment of the present invention, wherein FIG. 8 is a schematic, cross-sectional diagram showing a structure of a power transistor device. As shown in FIG. 1, a substrate 102, such as a silicon wafer, having a first conductivity type is provided. Then, a first epitaxial growth process is carried out to form a first epitaxial layer 104 on the substrate 102. Subsequently, a first patterned mask layer 106 having a plurality of first openings 106a is formed on the first epitaxial layer 104, wherein a portion of the first epitaxial layer 104 can be exposed from the first openings 106a. The first epitaxial layer 104 is patterned through a first patterning process by using the first openings 106a as an etching mask. As a result, a plurality of trenches 104a is formed in the first epitaxial layer 104. In this invention, the epitaxial growth processes include a physical vapor deposition, a chemical vapor deposition process and so forth, but is not limited thereto. Each trench 104a can penetrate through the first epitaxial layer 104 and expose a portion of the substrate 102.

Figure 2:
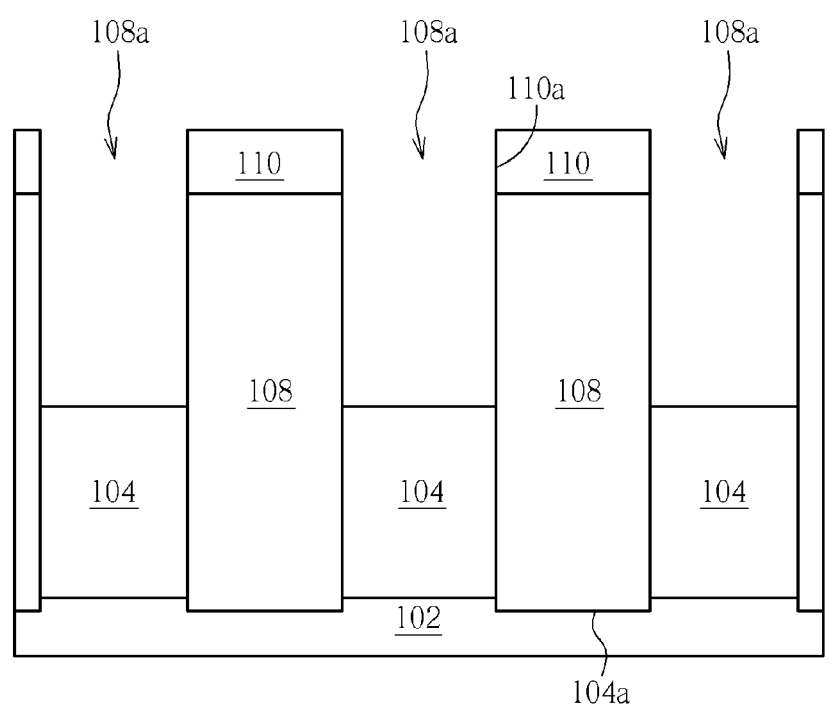

Please refer to FIG. 2. The first patterned mask layer 106 is removed and a second epitaxial growth process is carried out to form a second epitaxial layer 108 covering the first epitaxial layer 104. The second epitaxial layer 108 can also fill up each trench 104a during the second epitaxial growth process, and a top surface of the second epitaxial layer 108 is higher than a top surface of the first epitaxial layer 104. Subsequently, a second patterned mask layer 110 having a plurality of second openings 110a is formed on the second epitaxial layer 108. A location of each second opening 110a is right above a location of the first epitaxial layer 104, and the second openings 110a can expose the second epitaxial layer 108 disposed on the first epitaxial layer 104. The second epitaxial layer 108 is patterned through a second patterning process by using the second patterned mask 110 as an etching mask. As a result, a plurality of first through holes 108a is formed in the second epitaxial layer 108, wherein the first through holes 108a can penetrate the second epitaxial layer 104 and expose the first epitaxial layer 104. In this embodiment, the first epitaxial layer 104 has a first conductivity type, and the second epitaxial layer 108 has a second conductivity type different from the first conductivity type. More specifically, the first epitaxial layer 104 and the second epitaxial layer 108 have an N-type conductivity type and a P-type conductivity type, respectively, but are not limited thereto. That is to say, conductivity types of the first epitaxial layer 104 and the second epitaxial layer 108 can be switched. Since the N-type first epitaxial layer 104 and the N-type substrate 102 have the same conductivity type, it is not limited to let the trenches 104a penetrate the N-type first epitaxial layer 104. That is to say, the trenches 104a may be formed without penetrating the N-type first epitaxial layer 104. In addition, the number of the first openings 106a and trenches 104a is not limited to more than one; in other embodiments there may be only a single first opening and a single trench. In this embodiment, a width of the first opening 108a is substantially the same as that of the N-type first epitaxial layer 104 located between the two adjacent trenches 104a, but is not limited thereto. In other cases, a width of the first opening 108a may be larger or smaller than that of the N-type first epitaxial layer 104 located between the two adjacent trenches 104a. Furthermore, in order to have the P-type epitaxial layer 108 fully fill up each trench 104a, the thickness of the P-type epitaxial layer 108 deposited on the N-type first epitaxial layer 104 is larger than one-half width of each trench 104a.

Figure 3:
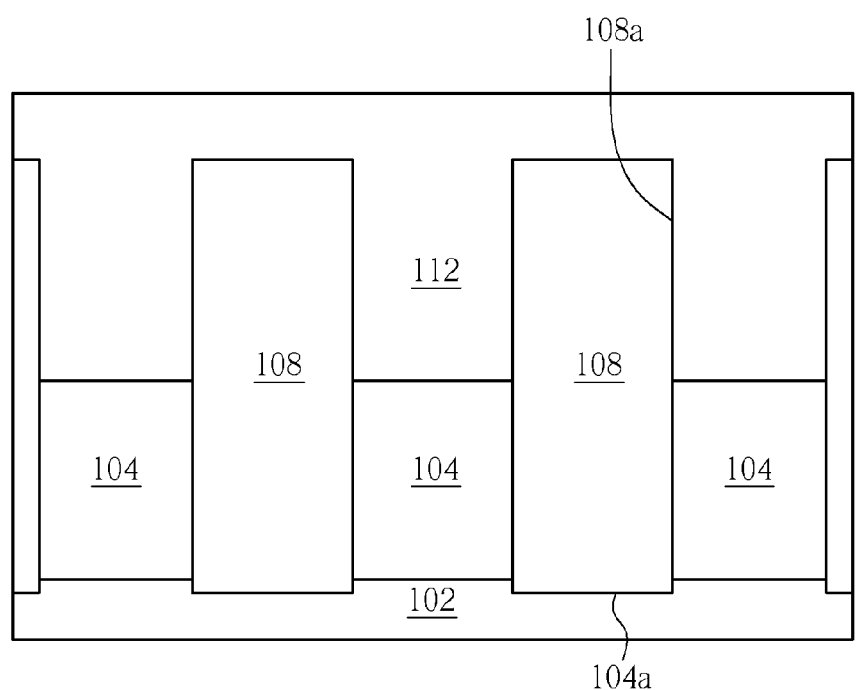

Please refer to FIG. 3. The second patterned mask is removed and a third epitaxial growth process is carried out to form an N-type third epitaxial layer 112 covering the P-type second epitaxial layer 108. The N-type third epitaxial layer 112 can also fill up each first through hole 108a during the third epitaxial growth process and is in direct contact with the N-type first epitaxial layer 104. At this time, several N-type columns, which includes the N-type first epitaxial layers 104 stacked with the N-type third epitaxial layers 112, and the P-type epitaxial layer 108 are arranged alternatively along a horizontal direction to respectively form several parallel PN junctions vertical to the N-type substrate 102. The structure of these PN junctions is also called a super junction structure, which can be used to withstand high voltages from the N-type substrate 102. In this embodiment, as described above, the width of the first opening 108a is substantially the same as that of the N-type first epitaxial layer 104 located between the two adjacent trenches 104a. Therefore, the N-type third epitaxial layer 112 filling up each first through hole 108a has a width similar to that of the corresponding P-type epitaxial layer 108 disposed under the N-type third epitaxial layer 112.

In order to make a super junction structure between the N-type first epitaxial layer 104 and the P-type epitaxial layer 108 and a super junction structure between the N-type third epitaxial layer 112 and the P-type epitaxial layer 108 have the same charge distribution and the same voltage-sustaining ability, a doping concentration of the N-type third epitaxial layer 112 is approximately the same as that of the N-type first epitaxial layer 104. In other cases, however, a width of the N-type third epitaxial layer 112 may be different from that of the N-type first epitaxial layer 104 located right under the corresponding N-type third epitaxial layer 112. In some embodiments, when each N-type third epitaxial layer 112 has a width different from that of the N-type first epitaxial layer 104, a doping concentration of the N-type third epitaxial layer 112 may differ from that of the N-type first epitaxial layer 104 in order to make a super junction structure between the N-type first epitaxial layer 104 and the P-type epitaxial layer 108 and a super junction structure between the N-type third epitaxial layer 112 and the P-type epitaxial layer 108 to have the same voltage-sustaining ability. For example, when the width of each N-type first epitaxial layer 104 is larger than that of the N-type third epitaxial layer 112, a doping concentration of the N-type first epitaxial layer 104 is preferably lower than that of the N-type third epitaxial layer 112, and vice versa. In this way, a super junction structure between the N-type first epitaxial layer 104 and the P-type epitaxial layer 108 and a super junction structure between the N-type third epitaxial layer 112 and the P-type epitaxial layer 108 will have the same voltage-sustaining ability.

It is worth noting that, since a position of each P-type epitaxial layer 108 is corresponding to a position of each trench 104a in the N-type first epitaxial layer 104, and a location of each first through hole 108a is corresponding to that of the N-type first epitaxial layer 104. This embodiment provides consecutive processes such as an N-type epitaxial growth process, a patterning process, a P-type epitaxial growth process, a patterning process and an N-type epitaxial growth process to respectively stack N-type epitaxial layers and P-type epitaxial layers on the N-type substrate 102 and to form a super junction structure with a predetermined height. Since P-type epitaxial layers are filled into trenches through many repeated epitaxial growth processes, problems resulting from conventional one-step filling process can be avoided, that is to say, no void will appear in the P-type epitaxial layers and no defects will exist at the interface of PN junctions. Additionally, restrictions on etching processes for forming trenches and on epitaxial growth processes can also be avoided.

Figure 4:
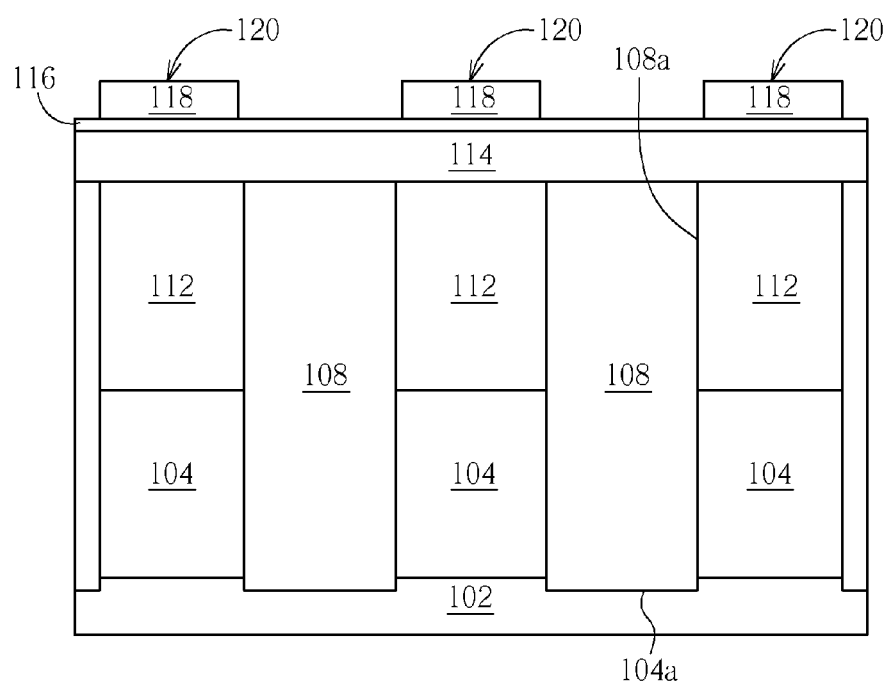

Please refer to FIG. 4. At least an etching and at least an etching back process are carried out to remove the N-type third epitaxial layer 112 above the P-type second epitaxial layer 108. As a result, a top surface of the P-type second epitaxial layer 108 is leveled with a top surface of the N-type third epitaxial layer 112. Subsequently, an N-type fourth epitaxial layer 114 covering the P-type second epitaxial layer 108 and the N-type third epitaxial layer 112 is formed through a fourth epitaxial growth process. The N-type fourth epitaxial layer 114 can be further covered by an insulating layer 116, such as silicon oxide ($SiO_2$). After the above saying process, a deposition, a photolithographic and an etching processes are performed consecutively to form a plurality of gate conductive layers 118, such as polysilicon, on the insulating layer 116. The gate conductive layers 118 can be used as gate electrode of the power transistor device. Each gate conductive layer 118 is located right above the N-type third epitaxial layer 112, wherein each gate conductive layer 118 in combination with the underlying insulating layer 116 can comprise a gate structure 120.

Figure 5:
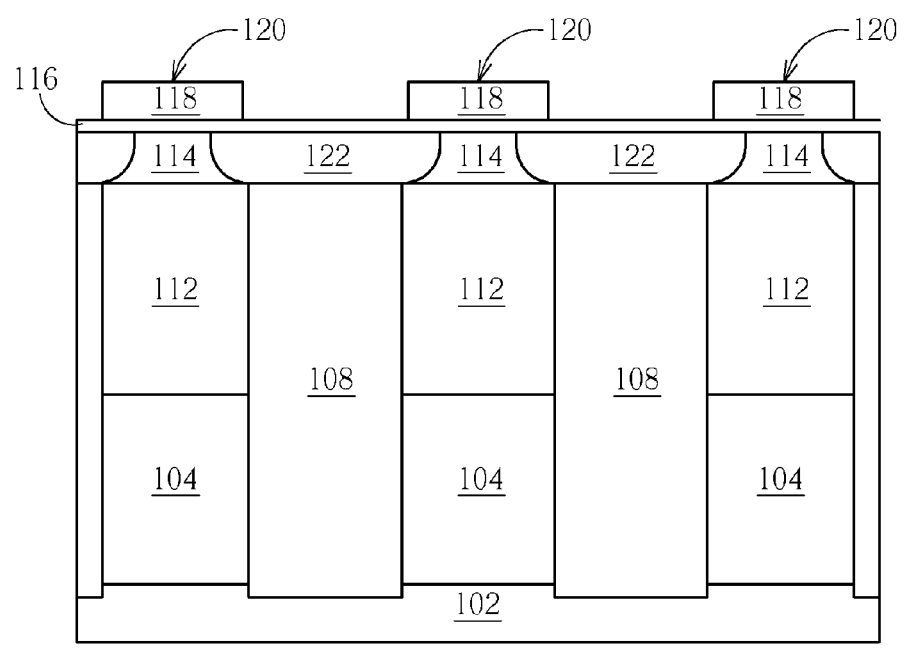

As shown in FIG. 5, a P-type ion implantation process and a thermal drive-in process are consequently carried out by using the gate conductive layers 118 as a mask. In this way, at least a P-type doped body region 122 can be formed in the N-type fourth epitaxial layer 114 between two adjacent gate structures 120, wherein each P-type doped body region 122 is in contact with the corresponding P-type second epitaxial layer 108 and partially overlaps the gate structure 120. The P-type doped body regions 122 can serve as body electrodes of a power transistor device. In this embodiment, the first epitaxial layer may have a P-type conductivity which is different from a conductivity type of the second epitaxial layer, while the second epitaxial layer may have the same conductivity type as the substrate, that is, N-type. Furthermore, a position of the gate structure corresponds to that of the N-type second epitaxial layer so that the P-type doped body region is located above the third epitaxial layer and is in direct contact with the third epitaxial layer.

Please refer to FIG. 6. By using a photomask (not shown), another N-type ion implantation process and another thermal drive-in process are carried out consequently. As a result, two N-type doped source regions 124 are formed in each of the P-type doped body regions 122, and partially overlap each of the gate structures 120, which can serve as sources in a power transistor device. The number of the respective gate structures 120, P-type doped body regions 122 and N-type doped source regions 124 is not limited to be superior to one; they also may be single structures and regions. The number of which can be adjusted according to particular requirements. These contact holes 128 may also expose a portion of the gate conductive layers 118 to form gate contact holes (not shown). In this embodiment, a P-type ion implantation process and a thermal drive-in process are carried out consequently after the contact holes 128 are formed. In this way, a P-type doped contact region is formed in each of the P-type doped body regions, but is not limited thereto.

As shown in FIG. 7, a dielectric layer 126, such as silicon oxide, is formed to cover the gate conductive layers 118 and the insulating layer 116. Subsequently, through performing a photolithographic and an etching process, a plurality of contact openings 128 is formed in the dielectric layer 126 and the insulating layer 116. Each contact hole 128 can therefore expose the N-type doped source regions 124 and the P-type doped body region 122.

As shown in FIG. 8, a drain metal layer 130 can be formed above the dielectric layer 126 and in the contact holes 128. A drain metal layer 132 can then be formed on the bottom of the P-type substrate 102. In this embodiment, steps for forming the source metal layer 130 and the drain metal layer 132 may include sputter deposition, electron beam deposition process and so forth. The composition of the source metal layer 130 and the drain metal layer 132 may be selected from the group consisting of titanium, titanium nitride, aluminum, tungsten, or other metal or metal composite, but is not limited thereto. At this time, a power transistor device 100 according to this embodiment is accomplished. According to other embodiments of the present invention, before forming the source metal layer 130, a contact plug (not shown) may be formed in each contact hole 128 or a barrier layer (not shown) may be formed on the surface of the N-type fourth epitaxial layer 114 exposed from the bottom of each contact hole 128.

It should be noted that a method of manufacturing a super junction structure in a power transistor device is not limited to the above embodiments as various changes and modifications may be made thereto without departing from the scope and the spirit of the present invention. In the following paragraphs, various embodiments or modifications will be further described. Additionally, for the sake of clarity and convenience, the same reference signs are generally used to refer to corresponding or similar features in the following modified and different embodiments.

Figure 9:
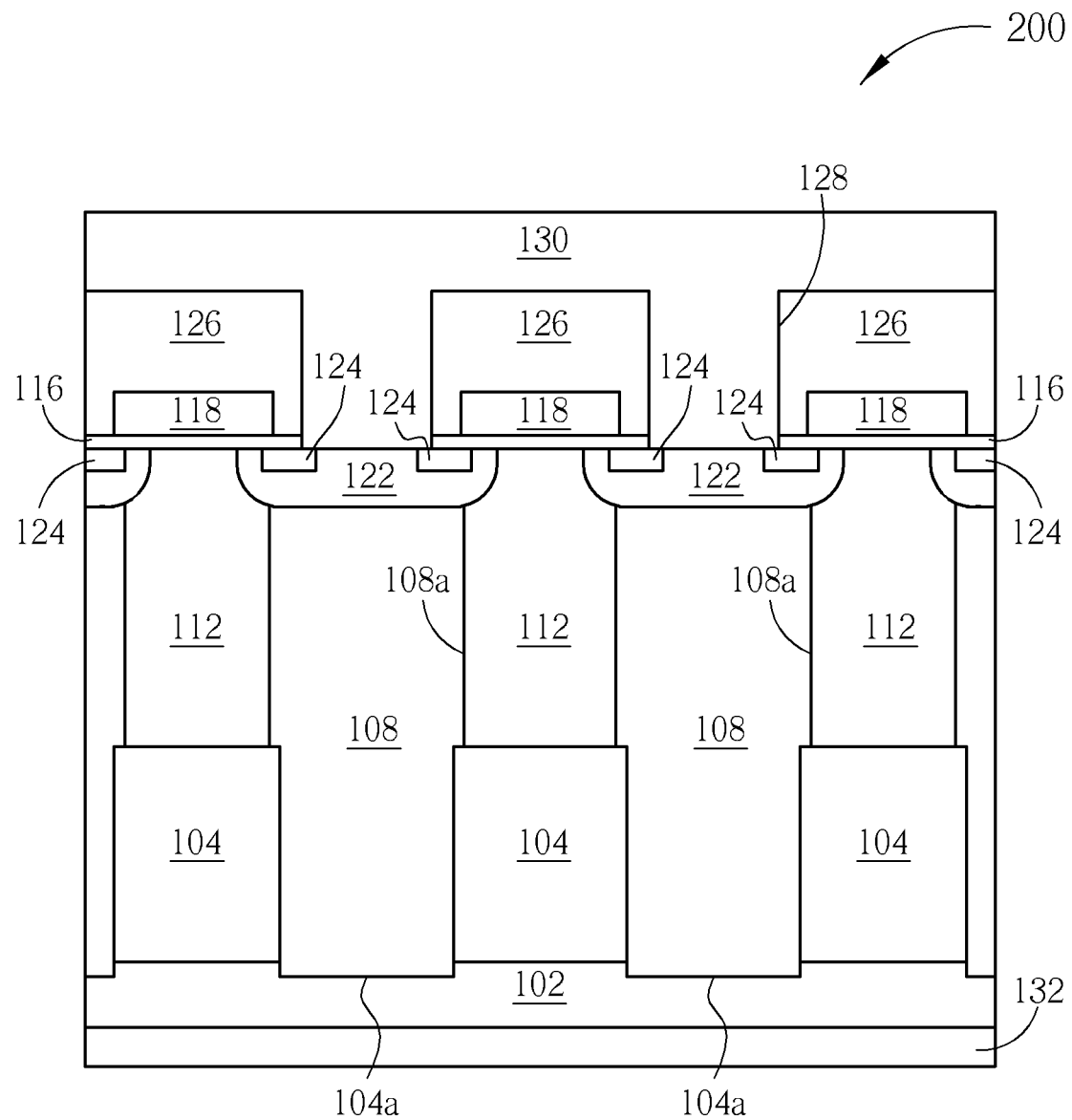
FIG. 9 is a schematic, cross-sectional diagram showing a power transistor device according a second embodiment of the present invention.

Please refer to FIG. 9 accompanied with FIGS. 1-3. FIG. 9 is schematic diagram showing a method of manufacturing a power transistor device according a second embodiment of the present invention. As shown in FIGS. 1-3, since fabricating processes before forming the third epitaxial layer described in this embodiment are the same as those shown in FIGS. 1-3 in the first embodiment, their detailed description is therefore omitted for the sake of clarity and convenience. Please still refer to FIG. 9. In comparison with the first embodiment, no etching and no etching back processes are performed after the formation of the N-type third epitaxial layer 112 so that a top surface of the N-type third epitaxial layer 112 is higher than a top surface of the P-type second epitaxial layer 108. An insulating layer 116 is formed on the N-type third epitaxial layer 112. In this embodiment, a width of the N-type third epitaxial layer 112 in each first through hole 112a is smaller than that of corresponding N-type first epitaxial layer 104 under the N-type third epitaxial layer 112. Furthermore, a doping concentration of the N-type third epitaxial layer 112 is heavier than that of the N-type first epitaxial layer 104, but is not limited thereto. Please still refer to FIG. 9. P-type doped body regions 122 are formed in the N-type third epitaxial layer 112 above the P-type second epitaxial layer 108. In order to let the P-type doped body regions 122 directly contact the P-type second epitaxial layer, a distance between a top surface of the N-type third epitaxial layer and a top surface of the P-type second epitaxial layer can be adjusted through modifying the ion implantation and the thermal drive-in processes. Since the subsequent processes are similar to those described in the first embodiment, the detailed descriptions of those are therefore omitted for the sake of clarity and convenience. In this embodiment, the P-type doped body regions 122 are disposed in the N-type third epitaxial layer 112 above the P-type second epitaxial layer 108. Accordingly, costs of polishing and etching back processes and of processes for forming the N-type fourth epitaxial layer 114 can be lowered down to the minimum.

Figure 10:
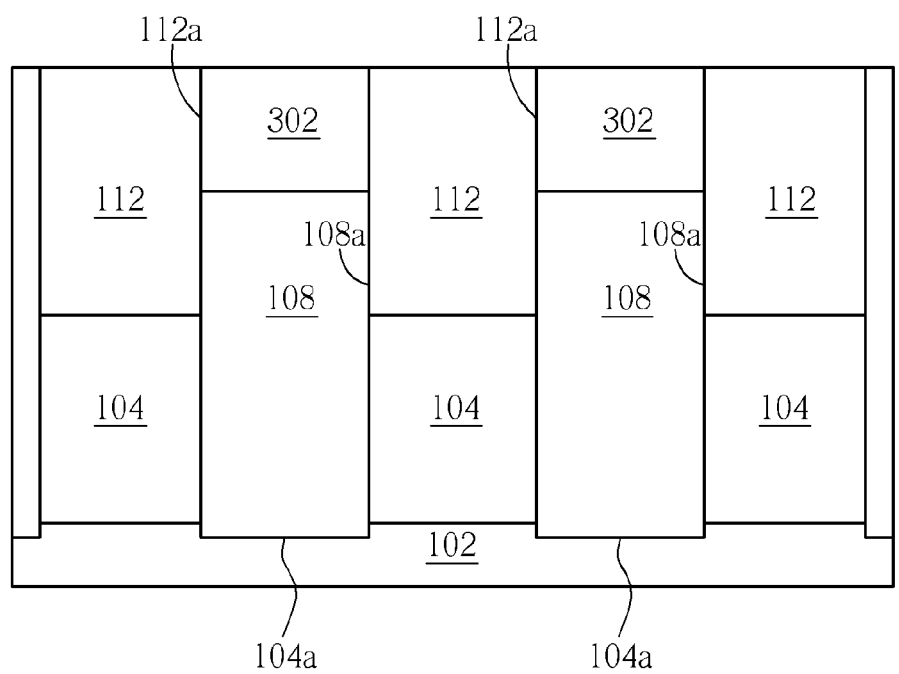
FIGS. 10 to 11 are schematic, cross-sectional diagrams illustrating a method of manufacturing a power transistor device according a third embodiment of the present invention.
Figure 11:
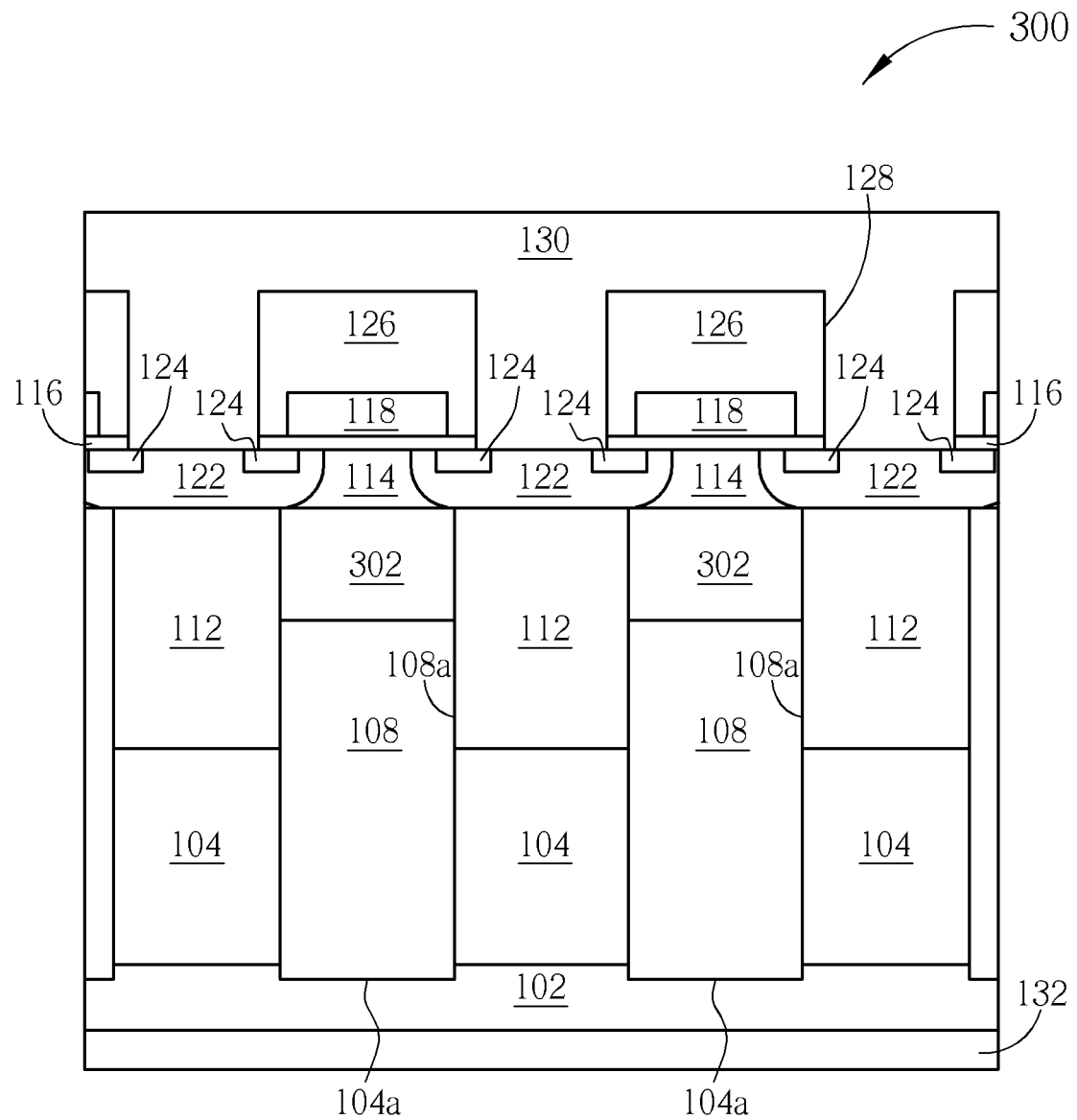

Please refer to FIG. 10 and FIG. 11 accompanied with FIGS. 1-3. FIGS. 10 and 11 are schematic diagrams showing a method of manufacturing a power transistor device according to a third embodiment of the present invention, wherein FIG. 11 is a schematic, cross-sectional diagram showing a structure of a power transistor device. In comparison with the first embodiment, a conductivity type of a first epitaxial layer and a third epitaxial layer is P-type, which is different from that of the substrate; while a conductivity type of a second epitaxial layer is the same as that of the substrate, which is P-type. Since fabricating processes before forming the third epitaxial layer are the same as those shown in FIGS. 1-3 in the first embodiment, their detailed description is therefore omitted for the sake of clarity and convenience. Please refer to FIG. 10. Compared to the first embodiment, this embodiment further provides a third patterning process after the accomplishment of the third epitaxial growth process. After the third patterning process, the P-type third epitaxial layer 112 is patterned and a plurality of second through holes 112a is therefore formed in the P-type third epitaxial layer 112, wherein the second through holes 112a can expose the corresponding N-type second epitaxial layer 108. After the above steps, a fifth epitaxial growth process is carried out to have an N-type fifth epitaxial layer 302 directly form on the P-type third epitaxial layer 112 and fill into the second through holes 112a. At this time, a portion of the N-type fifth epitaxial layer 302 is stacked on the N-type second epitaxial layer 108. Subsequently, at least an etching and at least an etching back process are carried out so that the N-type fifth epitaxial layer 302 higher than the surface of the P-type third epitaxial layer 112 can be removed. As a consequence, a top surface of the P-type third epitaxial layer 112 is leveled with a top surface of the N-type fifth epitaxial layer 302. Please refer to FIG. 11. A fourth epitaxial growth process is carried out to form an N-type forth epitaxial layer 114 on the surface of the P-type third epitaxial layer 112 and the N-type fifth epitaxial layer 302. Since the subsequent fabricating processes of this embodiment are the same as those illustrated in the first embodiment, their detailed description is therefore omitted for the sake of clarity and convenience. In this embodiment, the P-type doped body regions 122 of the power transistor device are in contact with the P-type third epitaxial layer 112. In other embodiments of the invention, a conductivity type of both the first epitaxial layer and the third epitaxial layer is N-type, which is the same as that of the substrate; while a conductivity type of the second epitaxial layer and the fifth epitaxial layer is different from that of the substrate, which is N-type. Since fabricating processes before forming the third epitaxial layer are the same as those shown in FIGS. 1-3 in the first embodiment, the detailed description of which is therefore omitted for the sake of clarity and convenience. Furthermore, a position of each gate structure corresponds to that of the N-type third epitaxial layer so that a P-type doped body region is located on and in direct contact with the P-type fifth epitaxial layer. Additionally, there may be no etching and no etching back process after the formation of the N-type fifth epitaxial layer so that a top surface of the N-type fifth epitaxial layer is higher than a top surface of the P-type third epitaxial layer. This way, the P-type doped body regions may be formed in the N-type fifth epitaxial layer.

Figure 12:
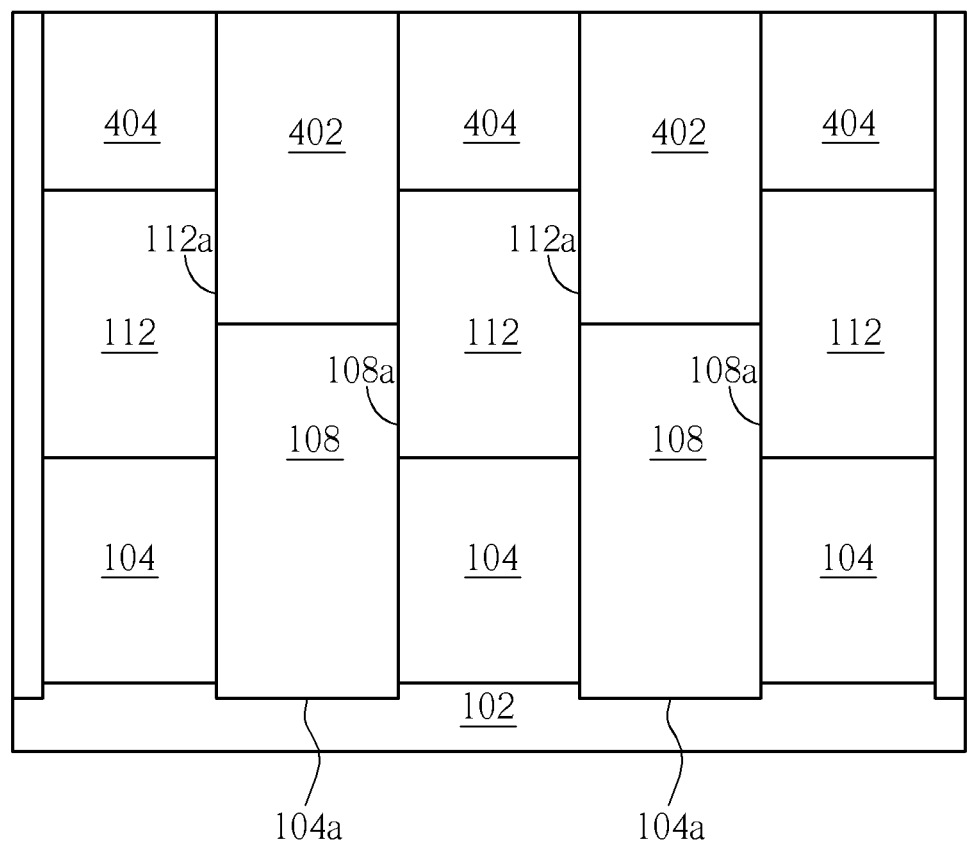
FIGS. 12 to 13 are schematic, cross-sectional diagrams illustrating a method of manufacturing a power transistor device according a fourth embodiment of the present invention.
Figure 13:
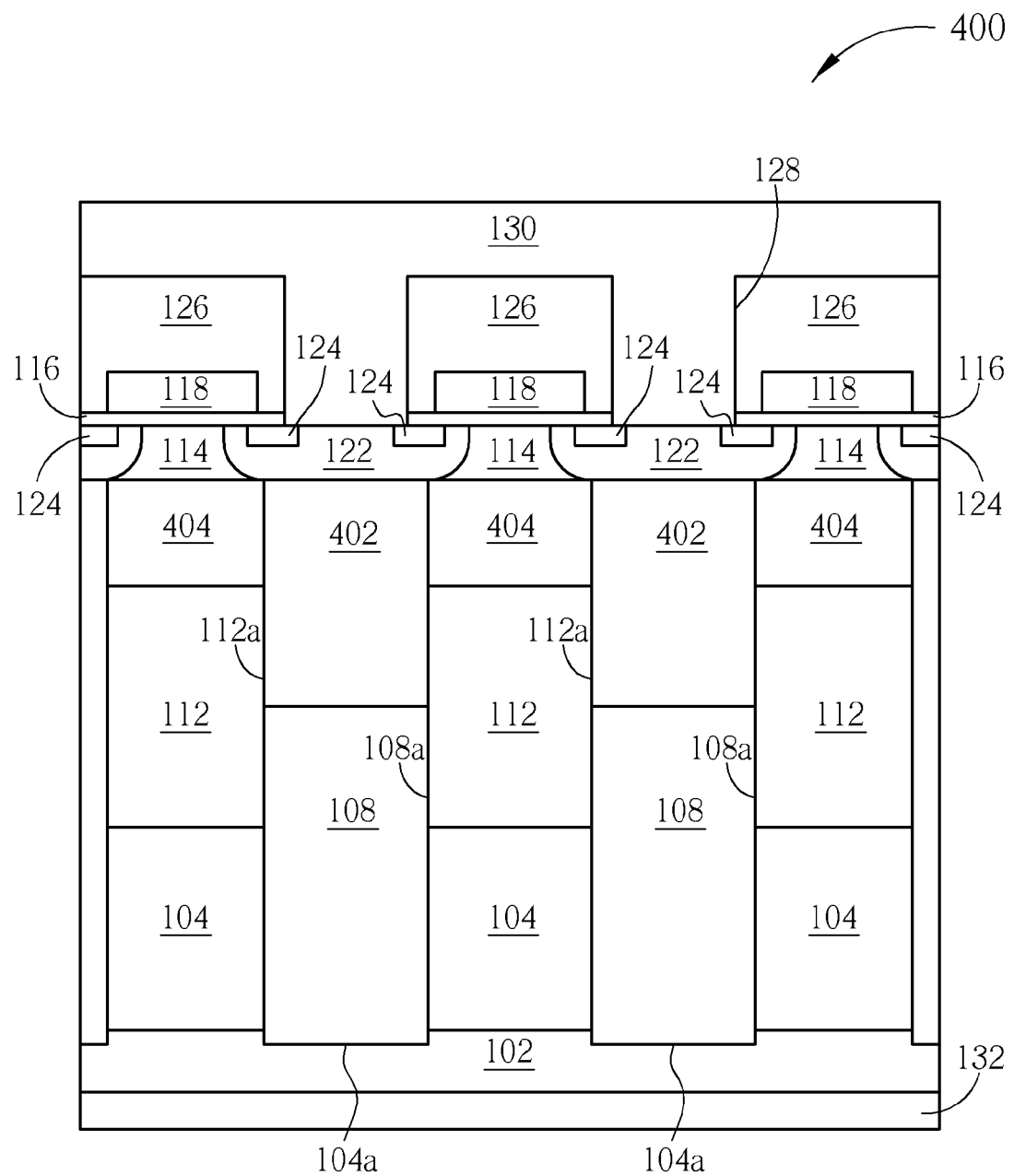

Please refer to FIG. 12 and FIG. 13 accompanied with FIGS. 1-3. FIGS. 12-13 are schematic diagrams showing a method of manufacturing a power transistor device according the fourth embodiment of the present invention, wherein FIG. 13 is a schematic, cross-sectional diagram showing a structure of a power transistor device. Since fabricating processes before forming an N-type third epitaxial layer is the same as those shown in FIGS. 1-3 in the first embodiment, their detailed description is therefore omitted for the sake of clarity and convenience. Please refer now to FIG. 12. In comparison with the first embodiment, fabricating processes described in this embodiment further include patterning the N-type third epitaxial layer 112 to form a plurality of second through holes 112a in the N-type third epitaxial layer 112. In this way, each P-type second epitaxial layer 108 may be exposed by the corresponding through hole 112a. Similar processes, such as forming the P-type second epitaxial layer 108, patterning the P-type second epitaxial layer 108 and forming the N-type third epitaxial layer 112 are performed repeatedly at least once to form at least a P-type fifth epitaxial layer 402 on each P-type second epitaxial layer 108 and form at least an N-type sixth epitaxial layer 404 on each N-type third epitaxial layer 112, wherein the N-type sixth epitaxial layer 404 covers all the P-type fifth epitaxial layers 402. Subsequently, at least a polishing and at least an etching back process are carried out to remove the N-type sixth epitaxial layer 404 that is higher than the surface of the P-type fifth epitaxial layer 402. As a result, a top surface of the N-type sixth epitaxial layer 404 is leveled with a top surface of the P-type fifth epitaxial layer 402. Please refer now to FIG. 13. A fourth epitaxial growth process is carried out to form an N-type forth epitaxial layer 114 on the surface of the N-type sixth epitaxial layer 404 and the P-type fifth epitaxial layer 402. Since the following processes are similar to those described in the first embodiment, the detailed description of those is therefore omitted for the sake of clarity and convenience. In this embodiment, the P-type doped body regions 122 of the power transistor device 400 are in contact with the P-type fifth epitaxial layer 402. Since the following processes are also similar to those described in the first embodiment, the detailed description of those is therefore omitted for the sake of clarity and convenience. In other embodiments of the invention, a conductivity type of the first epitaxial layer, the third epitaxial layer and the sixth epitaxial layer is of P-type, which is different from that of the substrate; while a conductivity type of the second epitaxial layer and the fifth epitaxial layer is the same as that of the substrate, which is N-type. Furthermore, a position of each gate structure is corresponding to that of the N-type fifth epitaxial layer so that the P-type doped body region is located on and in direct contact with the P-type sixth epitaxial layer.

To summarize, the present invention repeatedly performs an N-type epitaxial growth process, a patterning process, a P-type epitaxial growth process and a patterning process to respectively stack N-type epitaxial layers and P-type epitaxial layers on a substrate. Additionally, this stack structure can form a super junction structure with a predetermined height. Since P-type epitaxial layers are filled into trenches through many repeated epitaxial growth processes, problems resulting from conventional one-step filling process can be avoided. As a result, no void will appear in the P-type epitaxial layers and no defects will exist at the interface of PN junctions. In addition, a doping concentration of each N-type epitaxial layer may be correspondingly adjusted based on a width of the N-type epitaxial layer. As a consequence, a much uniform charge distribution can be obtained in the super junction structure and a voltage sustaining ability of this super junction structure is hence improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of manufacturing a power transistor device with a super junction, comprising:
providing a substrate having a first conductivity type;
forming a first epitaxial layer on the substrate;
patterning the first epitaxial layer to form a plurality of trenches in the first epitaxial layer;
forming a second epitaxial layer on the first epitaxial layer and filling up the trenches with the second epitaxial layer, wherein the second epitaxial layer and the first epitaxial layer have different conductivity types;

patterning the second epitaxial layer to form a plurality of first through holes in the second epitaxial layer, wherein the through holes can expose the first epitaxial layer; and forming a third epitaxial layer on the second epitaxial layer, wherein the third epitaxial layer fills up the first through holes and is in contact with the first epitaxial layer, and the third epitaxial layer and the first epitaxial layer have the same conductivity type, wherein the first epitaxial layer and the third epitaxial layer have different doping concentrations, and the first epitaxial layer and the third epitaxial layer have different widths in a direction parallel to a top surface of the substrate.

2. The method of manufacturing the power transistor device with the super junction according to claim 1, wherein the first epitaxial layer has a first conductivity type, and the second epitaxial layer has a second conductivity type different from the first conductivity type.

3. The method of manufacturing the power transistor device with the super junction according to claim 2, wherein after forming the third epitaxial layer, the method further comprises removing the third epitaxial layer on the second epitaxial layer so that a top surface of a third epitaxial layer is leveled with a top surface of the second epitaxial layer.

4. The method of manufacturing the power transistor device with the super junction according to claim 3, wherein after removing the third epitaxial layer on the second epitaxial layer, the method further comprises:
covering the second epitaxial layer and the third epitaxial layer with a fourth epitaxial layer having the first conductivity type;
forming at least a gate structure on the fourth epitaxial layer;
forming at least a doped body region having the second conductivity type in the fourth epitaxial layer, wherein the doped body region partially overlaps the gate structure and is in contact with the second epitaxial layer; and
forming at least a doped source region having the first conductivity type in the doped body region, wherein the doped source region partially overlaps the gate structure.

5. The method of manufacturing the power transistor device with the super junction according to claim 2, wherein after forming the third epitaxial layer, the method further comprises:
forming at least a gate structure on the third epitaxial layer; and
at least a doped body region having the second conductivity type disposed in the third epitaxial layer on one side of the gate structure and partially overlapped by the gate structure, wherein the doped body region is in contact with the second epitaxial layer.

6. The method of manufacturing the power transistor device with the super junction according to claim 2, further comprising repeating the steps of forming the second epitaxial layer, patterning the second epitaxial layer and forming the third epitaxial layer at least once, and forming at least a fifth epitaxial layer on the second epitaxial layer and forming at least a sixth epitaxial layer on the third epitaxial layer, wherein the fifth epitaxial layer has the second conductivity type and the sixth epitaxial layer has the first conductivity type.

7. The method of manufacturing the power transistor device with the super junction according to claim 1, wherein the first epitaxial layer has a second conductivity type different from the first conductivity type, and the second epitaxial layer has the first conductivity type.

8. The method of manufacturing the power transistor device with the super junction according to claim 7, wherein after forming the third epitaxial layer, the method further comprises patterning the third epitaxial layer to form a plurality of second through holes in the third epitaxial layer, wherein the second through holes expose the second epitaxial layer respectively.

9. The method of manufacturing the power transistor device with the super junction according to claim 8, wherein after patterning the third epitaxial layer, the method further comprises forming at least a fifth epitaxial layer on the second epitaxial layer exposed by the second through holes, wherein the fifth epitaxial layer has the first conductivity type.

* * * * *